United States Patent [19]
Weisenbach

[11] Patent Number: 5,670,869
[45] Date of Patent: Sep. 23, 1997

[54] REGULATED COMPLEMENTARY CHARGE PUMP WITH IMBALANCED CURRENT REGULATION AND SYMMETRICAL INPUT CAPACITANCE

[75] Inventor: Robert J. Weisenbach, Cupertino, Calif.

[73] Assignee: Sun Microsystems, Inc., Mountain View, Calif.

[21] Appl. No.: 655,148

[22] Filed: May 30, 1996

[51] Int. Cl.$^6$ .................................................. G05F 3/16
[52] U.S. Cl. ................................................. 323/313; 363/60
[58] Field of Search .......................... 323/313; 307/525, 307/262; 327/530, 536

[56] References Cited

U.S. PATENT DOCUMENTS

4,598,217  7/1986  Predina et al. ...................... 307/525
5,036,216  7/1991  Hohmann et al. .................... 309/269
5,124,631  6/1992  Terashima .......................... 323/313
8,308,748  9/1994  Rogers .

Primary Examiner—Peter S. Wong
Assistant Examiner—Rajnikant B. Patel
Attorney, Agent, or Firm—Hopkins & Carley

[57] ABSTRACT

A CMOS regulated complementary charge pump circuit uses imbalanced current regulation and symmetrical capacitive loading of input signals to provide a proportional response and high sensitivity at small phase differences. The charge pump is suitable for operation at very high frequencies, and therefore finds applications in delay-locked and phase-locked loops used to regenerate system clock signals within VLSI circuits. The use of current limiting devices in the switch pass gates permits a balancing of the capacitive loads presented to the input signals. Adjustable capacitors permit the elimination of a static phase offset at a zero operating point.

17 Claims, 4 Drawing Sheets

REGULATED COMPLEMENTARY CHARGE PUMP WITH IMBALANCED CURRENT REGULATION AND SYMMETRICAL INPUT CAPACITANCE

BACKGROUND OF THE INVENTION

1. Field of the Invention

The present invention relates to a CMOS charge pump and more particularly to a regulated complementary charge pump circuit having imbalanced regulation of the current source and sink, and having symmetrical capacitive loading of the control inputs.

2. Background of the Invention

A charge pump is a circuit which receives a pair of input pulses and alternatively connects a constant current source and a constant current sink to an output line depending upon which input pulse is active. The output connection lasts for the duration of the pulse. Many charge pump circuits are unable to resolve input pulses of extremely short duration. This shortcoming limits their use in modern VLSI which often operate at very high frequencies.

Figure 1:
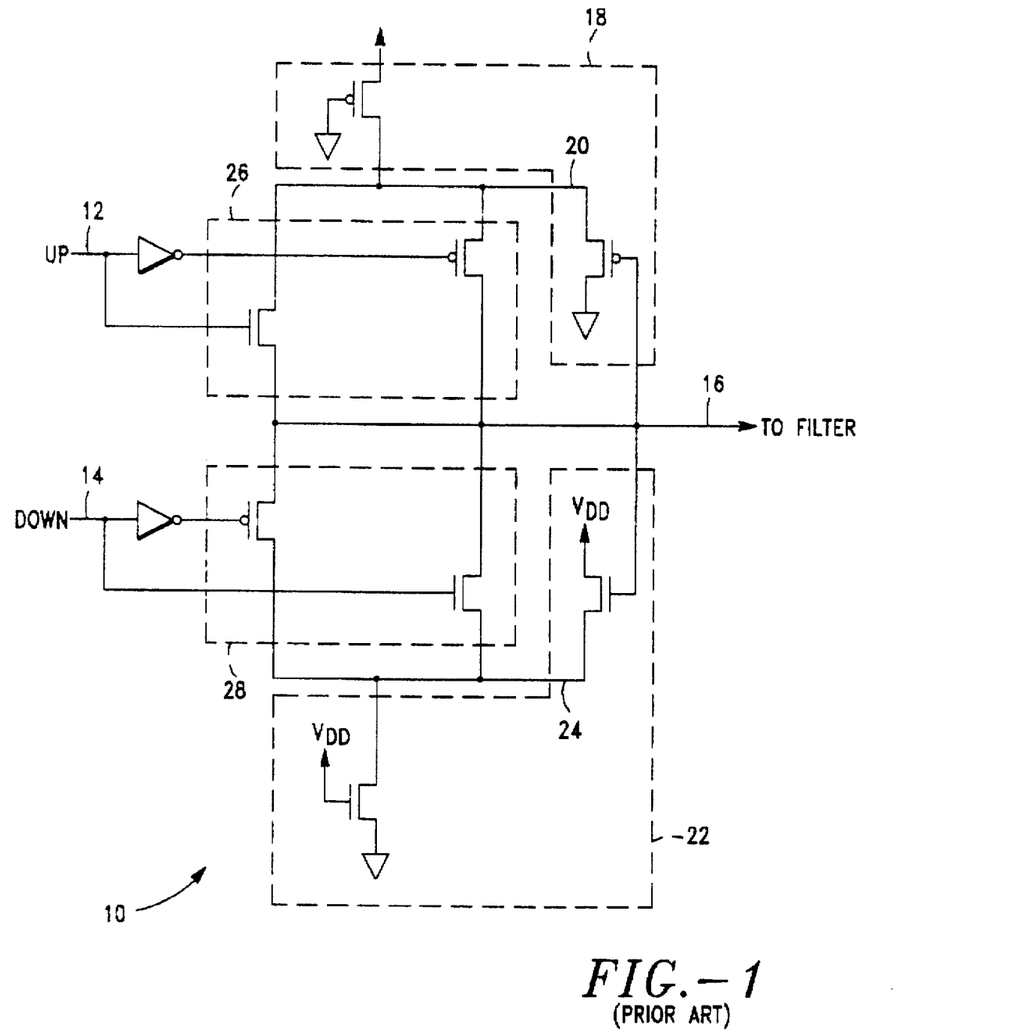
FIG. 1 is a schematic diagram of a prior art charge pump circuit.

FIG. 1 is a schematic diagram illustrating a prior art charge pump circuit having an improved response to very small phase differences, and is described in a formerly co-pending U.S. patent application, Ser. No. 08/308,748, entitled "Regulated Complementary Charge Pump Circuit," filed Sep. 19, 1994, flow U.S. Pat. No. 5,592,370, issued Jan. 7, 1997, and assigned to the assignee of the present invention. The disclosure of said formerly co-pending Application is incorporated by reference herein.

The charge pump circuit of FIG. 1 is designated generally by the numeral 10 and includes input signal lines UP 12 and DOWN 14, output line 16, a constant current source node regulator 18, a source node 20, a constant current sink node regulator 22, a sink node 24, a source switch pass gate 26, and a sink switch pass gate 28.

In general, the regulator 18 maintains the source node 20 at a constant voltage offset above a voltage level at the output line 16, while the regulator 22 maintains the sink node 24 at an equal constant voltage offset below the output line 16 voltage level. When the UP input 12 is active, the source switch pass gate 26 connects the source node 20 to the output line 16. When the DOWN input 14 is active, the sink switch pass gate 28 connects the sink node 24 to the output line.

Optimum performance of the charge pump in FIG. 1 is obtained by adjusting the width of individual transistors. Computer simulations of the optimized charge pump circuit of FIG. 1 reveal that when the duration of the input pulses on lines 12, 14 are less than about 75 pico-seconds, the output current on line 16 is not linearly related to input pulse width. Near a point of zero phase difference the output characteristic curve flattens out in what is know as a "dead zone."

It is believed that this non-linear behavior is related to an imbalance in capacitive loading of the input pulses and their inverses.

SUMMARY OF THE INVENTION

These difficulties are overcome in the present invention, a charge pump circuit in which the source and sink node regulators create a current imbalance between the individual pass transistors of the switch pass gates. Current limiting devices are added in series with the pass transistors permitting the transistors of the switch pass gates and of input signal inverters to be sized to equalize the capacitive load on the input signals and their inverses. These features improve the overall performance at phase differences less than ±50 pico-seconds.

In one embodiment, adjustable capacitors are used to selectively load the inverted input signals for eliminating a static phase offset at a zero operating point.

In other embodiments, the present invention defines a method for operating a charge pump to minimize phase jitter at very small phase differences, and defines delay-locked and phase-locked loops for use in clock regeneration circuits in VLSI.

DESCRIPTION OF THE DRAWINGS

For a further understanding of the objects, features and advantages of the present invention, reference should be had to the following description of the preferred embodiment, taken in conjunction with the accompanying drawing, in which like parts are given like reference numerals and wherein.

DESCRIPTION OF THE PREFERRED EMBODIMENT

Definitions

In keeping with a custom of the electronics field, no distinction will be made between signals and the lines which carry the signals, except where necessary to insure clarity of meaning. The signal levels of digital signals will be referred to as being at a high level ( or simply "high"), or at a low level ("low"), or as being asserted or negated, or active or inactive or ON or OFF.

A digital signal having transitions between defined switching levels will be said to include "switching features." An example of a switching feature is a rising edge. The phase of one digital signal with respect to another will be defined as the interval between a designated switching feature of the one signal to a corresponding switching feature of the other signal.

In comparing the phase of one digital signal with the phase of a second digital signal, one signal will be said to "lead" the other signal if a designated switching feature of the one signal occurs before a corresponding switching feature of the other signal, and will be said to "lag" the other signal if the switching feature of the one signal occurs after the corresponding switching feature of the other signal. A phase difference between two digital signals will be expressed as an interval of time (typically in units of "pico-seconds") measured between a designated switching feature of one signal and the corresponding switching feature of the other signal.

As used herein, the phrase "sequential phase-frequency detector" (also, simply "phase-frequency detector") defines a circuit for comparing the phase and the frequency of two digital input signals and for asserting one of two digital output signals depending upon whether a designated switching feature of one input signal lags or leads a corresponding switching feature of the other input signal. For purposes of definition, the input signals are referred to as the REFERENCE input and the LOCAL input. The output signals are referred to as the UP output and the DOWN output. When the frequency of the REFERENCE input is greater than the frequency of the LOCAL input, or when the frequencies are the same and the phase of the REFERENCE input leads the phase of the LOCAL input, the UP output is made active during the interval between a designated switching feature of the REFERENCE input and the corresponding switching feature of the LOCAL input. When the frequency of the REFERENCE input is less than the frequency of the LOCAL input, or when the frequencies are the same and the phase of the REFERENCE input lags the phase of the LOCAL input, the DOWN output is made active during the interval between the designated switching feature of the LOCAL input and the corresponding switching feature of the REFERENCE input.

As used herein, the phrase "regulated complementary charge pump" (also, simply "charge pump") defines a circuit having two digital input signals and one output current line. When one input signal is active, the output line is connected to a regulated current source. When the other input signal is active, the output line is connected to a regulated current sink. One input line is referred to as the UP input and connects the output line to the current source. The other input line is referred to as the DOWN input and connects the output line to the current sink.

FIG. 2

Figure 2:
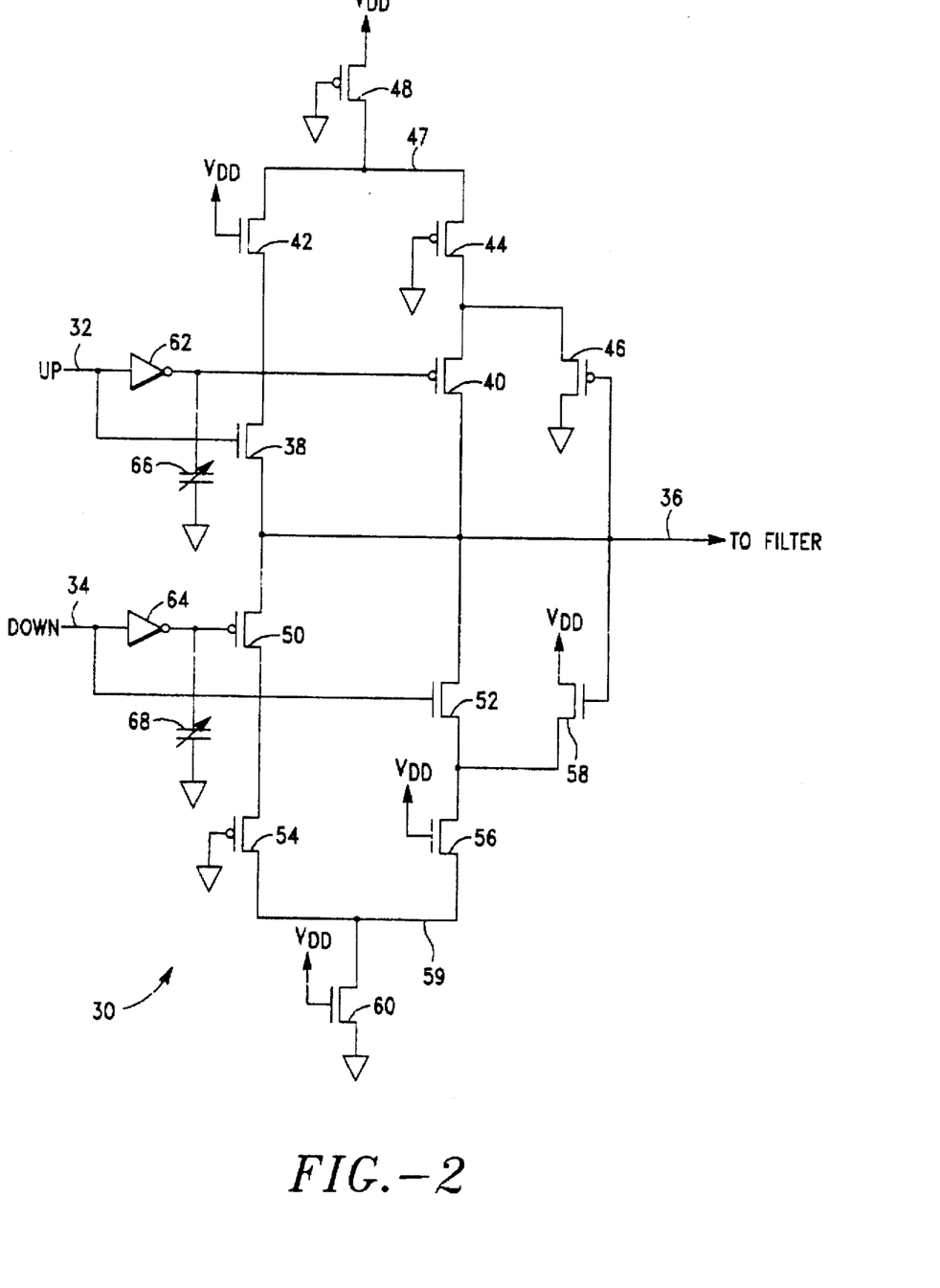
FIG. 2 is a schematic diagram of a regulated complementary charge pump circuit according to the present invention.

FIG. 2 is a schematic diagram illustrating a charge pump according to one aspect of the present invention, designated generally by the numeral 30. The charge pump 30 includes input lines UP 32 and DOWN 34, an output current line 36, source pass transistors 38, 40, source current limiting transistors 42, 44, source regulating transistors 46, 48, sink pass transistors 50, 52, sink current limiting transistors 54, 56, sink regulating transistors 58, 60, inverters 62, 64, and selectively connectable zero-point tuning capacitors 66 and 68.

In general, the pass transistors 38, 40 are selected by the UP input signal 32 for connecting a regulated current source to the output line 36, while the pass transistors 50, 52 are selected by the DOWN input signal 34 for connecting a regulated current sink to the output line 36. The output line 36 is typically connected to a filter circuit (not shown), which in a preferred embodiment includes a large integrated circuit capacitor (not shown). The charge pump 30 adds charge to the capacitor when the UP input signal 32 is active, and removes charge from the capacitor when the DOWN input signal 34 is active. A resulting voltage across the capacitor is available typically for controlling a voltage-controlled delay line in a delay-locked loop, or a voltage-controlled oscillator in a phase-locked loop. The signal UP 32 increases the voltage in proportion to the time UP is active, while the signal DOWN 34 decreases the voltage in proportion to the time DOWN is active.

The transistors 46, 48 define a source node 47, and within an operating region, regulate the node 47 so that it maintains an approximately constant voltage offset above a voltage at the output line 36. The effect of this regulation is to cause the source node 47 to present a constant current source to the output line 36 when the source pass transistors 38, 40 are selected by the UP input signal 32.

In complementary fashion, the transistors 58, 60 define a sink node 59, and within an operating region, regulate the node 59 so that it maintains an approximately constant voltage offset below a voltage at the output line 36. The effect of this regulation is to cause the sink node 59 to present a constant current sink to the output line 36 when the sink pass transistors 50, 52 are selected by the DOWN input signal 34.

Input Signal Loading

The size of the transistors of the prior art charge pump (FIG. 1) are individually selected to optimize the operation of the circuit. This variance in transistor size results in imbalanced capacitive loads on the input signals, UP and DOWN, and their inverses. This result is undesirable because it introduces variation of the output current unrelated to phase difference. The effect of the capacitive imbalance is particularly noticeable at very small phase differences in which the input pulses, UP, DOWN, are very narrow.

In one embodiment of the present invention, the capacitive loading of the input signals is balanced by use of transistors of comparable width connected to the input pulses and their inverses. The phrase "transistors of comparable width" refers to a circuit in which selected P-channel transistors have one uniform width, and selected N-channel transistors have another uniform width. To make practical the use of comparable width transistors, the current limiting transistors 42, 44, 54, 56 have been added in series with the corresponding pass transistors. This adaptation permits the pass transistors 38, 40, 50, 52 and the transistors within the inverters 62, 64 to be sized for balancing the capacitive load. This arrangement improves the circuit performance at very small phase differences and permits successful operation at higher frequencies than the prior art charge pump of FIG. 1.

Operating Regions

A saturation level for the transistors 48 and 60 defines two operating regions for the charge pump 30. At narrow input pulses having a width of less than approximately 50 picoseconds, the transistors 48, 60 are not saturated and the current transferred at the output line 36 is highly responsive to the width of the input pulse. This first operating region is therefore a region of higher gain. At pulse widths greater than approximately 50 pico-seconds, the transistors 48, 60 become saturated and the ability of the regulated current source and sink to move current is less sensitive to input pulse duration. This second operating region is a region of lower gain.

Current Imbalance

The regulation of the source node 47 and of the sink node 59 is shown to be non-symmetrical, resulting in slightly different currents through the N-channel and the P-channel branches of the source pass gate (transistors 38, 40) and the sink pass gate (transistors 54, 56). This slight imbalance of current has been shown to produce a surprising improvement in the operation of the charge pump 30 at very small phase differences (i.e., very narrow input pulses).

The drain contact of transistor 46 is connected to the junction between the current limiting transistor 44 and the pass transistor 40, rather than being connected to the source node 47 as is more usual (see FIG. 1). This connection results in a slight imbalance in the current flowing through the two pass transistors 38, 40 when they are selected by a narrow pulse on the UP input 32.

In like manner, the source contact of transistor 58 is connected to the junction between the current limiting transistor 56 and the pass transistor 52, rather than being connected to the sink node 59 as is more usual (see FIG. 1). This connection results in a slight imbalance in the current flowing through the two pass transistors 50, 52 when they are selected by a narrow pulse on the DOWN input 34.

The effect of the imbalance is pronounced in the operating region of higher gain at small phase differences, and becomes negligible once the transistors 48, 60 become saturated.

To demonstrate the efficacy of the current imbalance, computer simulations (not shown) were conducted comparing two versions of the charge pump 30. One version was as shown in FIG. 2, while the other version was modified so that the drain contact of the transistor 46 was connected to the source node 47, and the source contact of the transistor 58 was connected to the sink node 59. The version shown in FIG. 2 displayed a markedly superior performance at very narrow input pulses. The performance of the modified circuit was similar to that of the prior art charge pump of FIG. 1.

Zero-Point Adjustment

In a preferred embodiment of the charge pump 30, two on-chip arrays of selectively connectable, progressively sized capacitors 66, 68 are provided for loading the outputs of the inverters 62, 64, respectively. The use of these capacitors permits the operation at the zero-point (i.e., zero phase difference) to be adjusted to virtually eliminate a static phase offset.

FIG. 3

Figure 3:
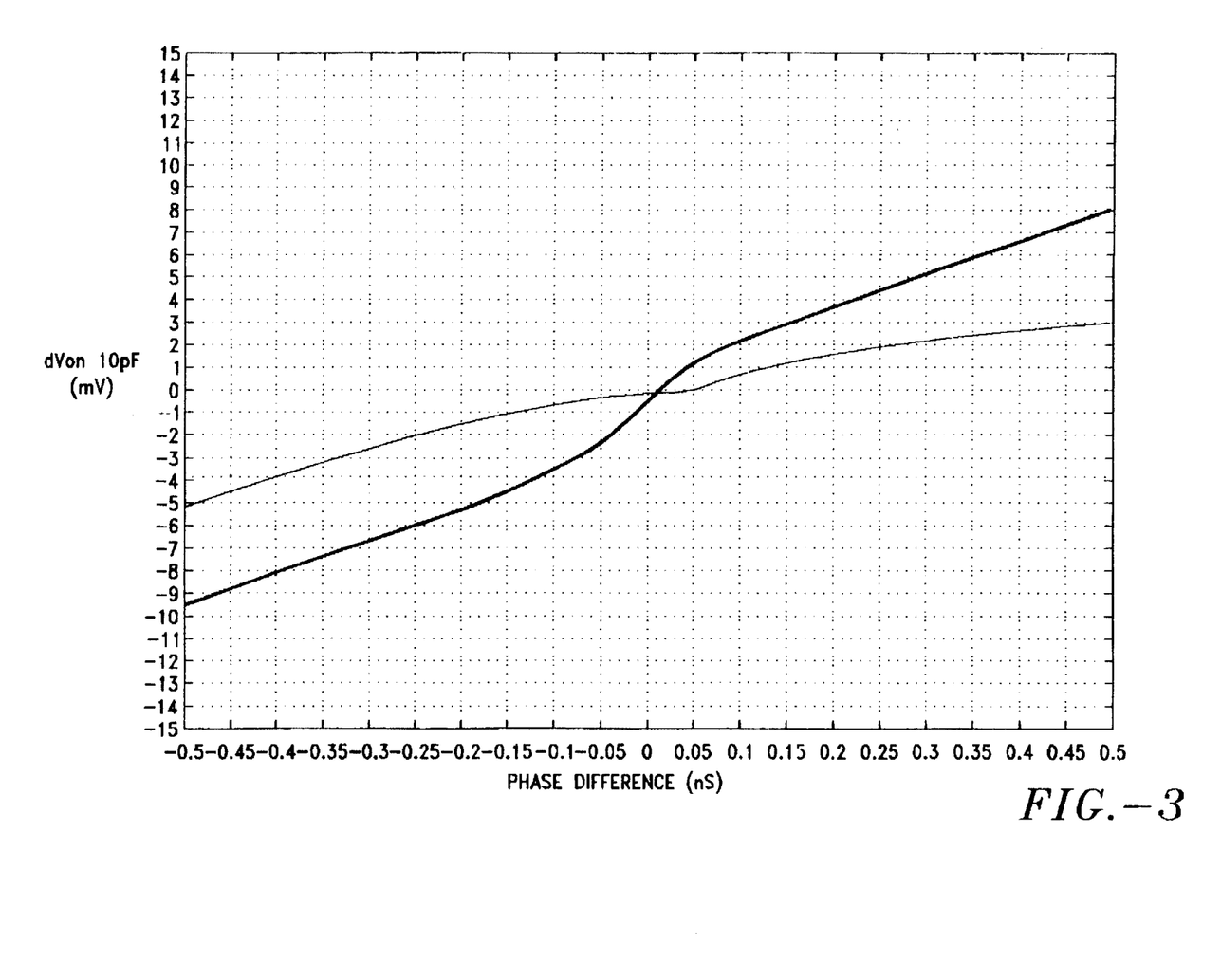
FIG. 3 is a graph of an open-loop computer simulation comparing phase-difference-versus-control-voltage curves for the prior art charge pump circuit and the present invention.

FIG. 3 is a graph representing a transfer characteristic curve (phase-difference-versus-change-of-output-voltage) for the prior art charge pump of FIG. 1 (narrow line) and the charge pump of the present invention, FIG. 2 (bold line). The curves were derived by a computer simulation of the two circuits. The horizontal axis of FIG. 3 represents phase-difference expressed in pico-seconds. The vertical axis represents a change in an output voltage across a simulated 10 pico-Farad capacitor, expressed in milli-volts.

A comparison of the two curves reveals that the charge pump 30 of the present invention produces a much larger change in the control voltage in the region between approximately +50 pico-seconds and −50 pico-second than does the prior art circuit. This greater sensitivity to small phase differences results in less phase jitter at very small phase differences.

FIG. 4,5

Figure 4:
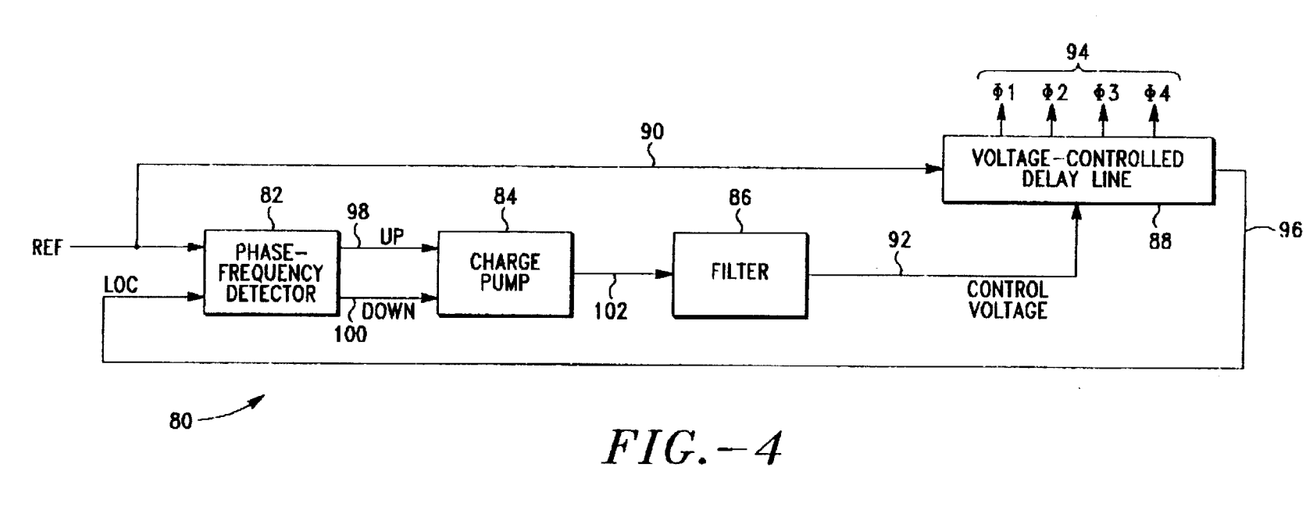
FIG. 4 is a block diagram illustrating a delay locked loop using a charge pump according to one aspect of the present invention.

With respect to FIG. 4, there is shown a block diagram illustrating a delay locked loop, depicted generally by the numeral 80, and including a phase-frequency detector 82, a charge pump 84, a filter 86, and a voltage-controlled delay line 88.

The delay line 88 receives a clock input signal REF 90 and a control voltage input signal 92. The delay line 88 provides output signals Φ1, Φ2, Φ3, Φ4, designated generally by the numeral 94, and output signal LOC 96. The delay of the delay line 88 varies between an upper and a lower limit as a function of the control voltage 92. At a nominal control voltage, the delay is equal to the duration of one cycle of the clock input signal REF 90 so that the output signal LOC 96 is in phase with and is delayed one clock cycle of the signal REF 90. The output signals Φ1–Φ4 94 represent the input signal REF 90 delayed successively by fractions of a single clock cycle.

The phase-frequency detector 82 receives the input signal REF 90 and the delay line output signal LOC 96. The phase-frequency detector 82 compares the phase and frequency of the two signals 90, 96 and provides output signals UP 98 and DOWN 100.

The charge pump 84 receives the signal UP 98 and the signal DOWN 100 and provides an output on line 102 for driving the filter 86, typically a large capacitor between line 102 and ground. The filter 86 provides the control voltage 92 for adjusting the delay of the delay line 88 to maintain phase lock between the input signal REF 90 and the delay line output signal LOC 96.

In a preferred embodiment, the charge pump 84 is identical with the charge pump 30 of FIG. 2. In another preferred embodiment, the entire delay-locked loop 80 is implemented as a CMOS circuit on a single integrated circuit. In another specific embodiment, a plurality of delay-locked loops 80 are implemented as CMOS circuits on a single integrated circuit, and each input REF 90 is connected to the system-wide REFERENCE clock signal.

Figure 5:
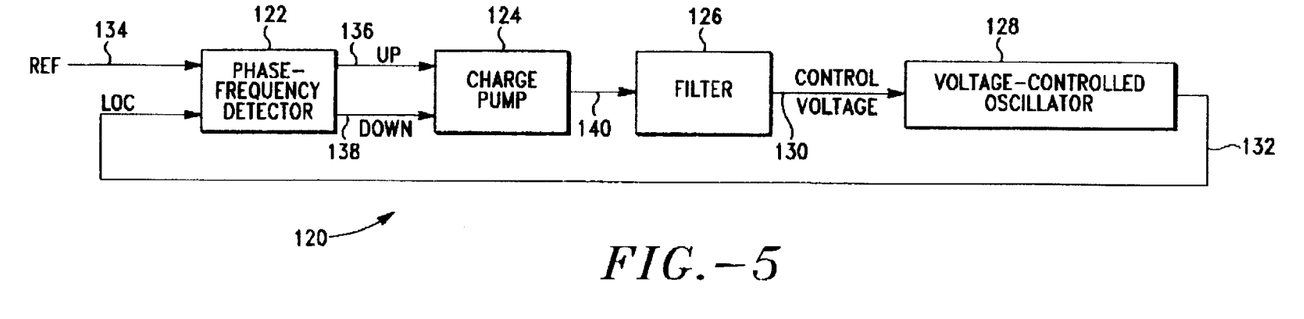
FIG. 5 is a block diagram illustrating a phase locked loop using a charge pump according to another aspect of the present invention.

FIG. 5 is a block diagram illustrating a phase locked loop which is designated generally by the numeral 120, and includes a phase-frequency detector 122, a charge pump 124, a filter 126 and a voltage-controlled oscillator 128.

The voltage-controlled oscillator 128 receives an analog control voltage input signal 130 and provides a clock output signal LOC 132. The frequency of the clock output signal LOC 132 varies as a function of the input control voltage 130.

The phase-frequency detector 122 receives a clock input signal REF 134 and the voltage-controlled oscillator output signal LOC 132. The phase-frequency detector 122 compares the phase of the two input signals 134, 132 and provides an output signal UP 136 and an output signal DOWN 138. The UP output signal 136 is active when the frequency of the signal LOC 132 is less than the frequency of the signal REF 134, and is also active when the phase of the signal LOC 132 is lagging the phase of the input signal REF 134, and is proportional to the phase difference. The output signal DOWN 138 is active when the frequency of the signal LOC 132 is greater than the frequency of the signal REF 134, and is also active when the phase of the signal LOC 132 leads the phase of the signal REF 134, and is proportional to the phase difference.

The charge pump 124 receives the UP signal 136 and the DOWN signal 138 and provides an output on line 140 for driving the filter 126. In a preferred embodiment of the phase-locked loop 120, the charge pump 124 is identical with the charge pump 30 of FIG. 2.

The filter 126 is typically a single large capacitor connected between the charge pump output line 140 and ground. The filter provides the control voltage signal 130 used to adjust the frequency of the voltage-controlled oscillator 128.

In a specific embodiment, the phase-locked loop 120 is a CMOS circuit implemented on a single integrated circuit. In another specific embodiment, a plurality of phase-locked loops 120 are implemented as CMOS circuits on a single integrated circuit, each circuit having its REF 134 input connected to the system-wide REFERENCE clock signal.

While the invention has been described in relation to the embodiments shown in the accompanying Figures, other embodiments, alternatives and modifications will be apparent to those skilled in the art. It is intended that the Specification be exemplary only, and that the true scope and spirit of the invention be indicated by the following claims.

What is claimed is:

1. A charge pump circuit, comprising:

an output line for supplying a regulated current in proportion to a duration of a first input pulse, and for sinking a regulated current in proportion to a duration of a second input pulse;

inverting means for providing inverses of the first and second input pulses;

current regulators defining a current source and a current sink;

a first pair of complementary pass transistors responsive to the first input pulse and its inverse for connecting the current source to the output line;

a second pair of complementary pass transistors responsive to the second input pulse and its inverse for connecting the current sink to the output line;

fixed bias means for reducing the current through each pass transistor; and regulated means, responsive to the output line, for reducing the current through one pass transistor relative to the other pass transistor of each complementary pair.

2. The charge pump circuit as set forth in claim 1, being implemented using CMOS transistors, and wherein the width of pass transistors connected to the input pulses and their inverses and the width of the transistors of the inverting means are selected to provide a balanced capacitive load to the input pulses and their inverses.

3. The charge pump circuit as set forth in claim 1, further including a plurality of progressively sized capacitors selectively connectable to the inverting means for adjusting a static phase offset at a zero operating point.

4. The charge pump circuit as set forth in claim 1, wherein each complementary pair of pass transistors includes an N-channel transistor and a P-channel transistor, the N-channel transistor controlled by the corresponding input pulse, and the P-channel transistor controlled by the corresponding inverted input pulse.

5. The charge pump circuit as set forth in claim 1, wherein the fixed bias means for reducing the current through each pass transistor includes a biased fully ON transistor of the same type as the corresponding pass transistor, connected in series between the pass transistor and the respective current source and current sink.

6. The charge pump circuit as set forth in claim 1, wherein the regulated means for reducing the current through one pass transistor with respect to the other pass transistor of each complementary pair includes a P-channel transistor having its gate connected to the output line, its source connected to ground, and its drain connected to the drain of the P-channel pass transistor in a current source path, and an N-channel transistor having its gate connected to the output line, its drain connected to a positive supply voltage line, and its source connected to the source of the N-channel pass transistor in a current sink path.

7. The charge pump circuit as set forth in claim 1, wherein the current regulators defining a current source and current sink define a current source node and a current sink node, and include a large P-channel transistor biased fully ON connected between the current source node and a positive supply voltage line, and a large N-channel transistor biased fully ON connected between the current sink node and ground.

8. The charge pump circuit as set forth in claim 1, wherein the regulated means, responsive to the output line cooperate with the regulators defining a current source and a current sink to provide a constant current source and a constant current sink.

9. A method for operating a charge pump to minimize phase jitter at very small phase-differences, the method comprising the steps of:

providing a regulated current source and a regulated current sink;

providing input lines for receiving first and second digital control pulses;

providing an output line;

providing inverters for inverting the first and second pulses;

providing a first pair of complementary pass transistors responsive to the first pulse and its inverse for connecting the current source to the output line;

providing a second pair of complementary pass transistors responsive to the second pulse and its inverse for connecting the current sink to the output line;

providing regulated means, responsive to the output line, for reducing the current through one pass transistor relative to the other pass transistor of each complementary pair;

reducing the current through one pass transistor relative to the other pass transistor of each complementary pair in proportion to a voltage level on the output line;

using the first pair of complementary pass transistors to connect the current source to the output line in response to the first pulse and its inverse; and using the second pair of complementary pass transistors to connect the current sink to the output line in response to the second pulse and its inverse.

10. The method as set forth in claim 9, further including the steps of:

providing fixed bias means for reducing the current through each pass transistor; and using the fixed bias means to reduce the current through each pass transistor, these additional steps preceding the steps of connecting the current source and sink to the output line in response to the first and second pulses and their inverses.

11. The method as set forth in claim 10, further including the step of adjusting the width of transistors connected to the first and second pulses and their inverses to balance a capacitive load.

12. The method as set forth in claim 11, further including the steps of:

providing a plurality of progressively sized capacitors;

selectively connecting the capacitors to the inverted pulses to adjust a static phase offset at a zero operating point.

13. A controlled loop for frequency and phase locking a local clock signal to a system reference signal, the loop comprising:

an input line for receiving the system reference signal;

an output line for providing the local clock signal;

a phase-frequency detector circuit connected to receive the input signal and the output signal and providing first and second digital control signals;

a charge pump circuit defining a constant current source and a constant current sink and including complementary pass transistors for connecting the current source to an output line while the first digital control signal is active and for connecting the current sink to the output line while the second digital control signal is active, and regulating means responsive to the output line for imbalancing the current through complementary pass transistors;

a filter circuit connected to receive the charge pump output line and providing an analog control voltage output signal;

a voltage-controlled device having one input connected to receive the analog control voltage, and an output line for supplying the local clock signal, whereby a frequency and phase locked loop is formed.

14. The controlled loop as set forth in claim 13, wherein the voltage-controlled device is a delay line having another input connected to receive the system reference signal, the analog control voltage controlling the delay, and the loop defining a delay-locked loop.

15. The controlled loop as set forth in claim 13, wherein the voltage-controlled device is an oscillator, the analog control voltage controlling the output frequency, and the loop defining a phase-locked loop.

16. The controlled loop as set forth in claim 13, being implemented as a CMOS integrated circuit.

17. The controlled loop as set forth in claim 13, wherein a plurality of the loops are implemented on a CMOS integrated circuit, each loop connected to a system wide reference clock signal, and defining clock regeneration circuits.

* * * * *

UNITED STATES PATENT AND TRADEMARK OFFICE
CERTIFICATE OF CORRECTION

PATENT NO. : 5,670,869
DATED : September 23, 1997
INVENTOR(S) : Robert J. Weisenbach It is certified that error appears in the above-identified patent and that said Letters Patent is hereby corrected as shown below:

Column 7, claim 3,
Line 35, insert -- , -- after "capacitors".

Signed and Sealed this

Sixth Day of November, 2001

Attest:

NICHOLAS P. GODICI
Attesting Officer   Acting Director of the United States Patent and Trademark Office